(12) United States Patent
Lin et al.

(10) Patent No.: US 8,067,806 B2
(45) Date of Patent: Nov. 29, 2011

(54) GATE STRUCTURES OF CMOS DEVICE AND METHOD FOR MANUFACTURING THE SAME

(75) Inventors: Chun-Hsien Lin, Tainan County (TW); Chin-Fu Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 111 days.

(21) Appl. No.: 12/557,535

(22) Filed: Sep. 11, 2009

(65) Prior Publication Data

US 2011/0062524 A1  Mar. 17, 2011

(51) Int. Cl.
*H01L 21/70* (2006.01)
(52) U.S. Cl. ........................................................ 257/369
(58) Field of Classification Search .................. 257/398, 257/368–377; 438/231
See application file for complete search history.

(56) References Cited

U.S. PATENT DOCUMENTS

| 6,696,345 | B2 | 2/2004 | Chau | |
| 2004/0222474 | A1* | 11/2004 | Chau et al. | 257/369 |
| 2005/0059198 | A1* | 3/2005 | Visokay et al. | 438/199 |
| 2009/0057787 | A1 | 3/2009 | Matsuki | |

OTHER PUBLICATIONS

Jörgen Westlinder et al., "Variable work function in MOS capacitors utilizing nitrogen-controlled TiNx gate electrodes", Nov. 2004, p. 389-396, vol. 75 Issue 4, Microelectronic Engineering.
Hitoshi Wakabayashi et al., "A Dual-Metal Gate CMOS Technology Using Nitrogen-Concentration-Controlled TiNx Film", IEEE Transactions on Electron Devices, vol. 48, No. 10, Oct. 2001, pp. 2363-2369.

* cited by examiner

*Primary Examiner* — Richard A. Booth
(74) *Attorney, Agent, or Firm* — Winston Hsu; Scott Margo (57) ABSTRACT

Gate structures of CMOS device and the method for manufacturing the same are provided. A substrate having an NMOS region, a PMOS region, and a work function modulation layer disposed on the NMOS region and the PMOS region is provided. A nitrogen doping process is performed to dope nitrogen into a portion of the work function modulation layer disposed on the PMOS region so as to form an N-rich work function modulation layer disposed on the PMOS region. A nonmetallic conductive layer is formed blanketly covering the work function modulation layer and the N-rich work function modulation layer. A portion of the nonmetallic conductive layer, the work function modulation layer, and the N-rich work function modulation layer is removed to form a first gate in the NMOS region and a second gate in the PMOS region.

4 Claims, 8 Drawing Sheets

GATE STRUCTURES OF CMOS DEVICE AND METHOD FOR MANUFACTURING THE SAME

BACKGROUND OF THE INVENTION

1. Field of the Invention

The present invention is related to gate structures of a CMOS device and a method for manufacturing the same, and particularly to a method to increase the work function of a work function modulation layer of the gate structure of the CMOS device by means of nitrogen doping process.

2. Description of the Prior Art

With the development of semiconductor technology and the increasing density of the devices, the complementary metal oxide semiconductor (CMOS) devices having characteristic of low energy consumption is broadly used in the integrated circuits.

Conventional polysilicon gate structure having a gate dielectric layer of SiO$_2$, and a conductive layer of polysilicon and WSi encounters a problem of size reduction during the tendency of miniaturizing the size of the device having the conventional polysilicon gate. Several materials are developed to be used in the gate structure, such as the dual work function metals, which are used to replace the conventional polysilicon layer in the gate structure. Conventional gate structures of the CMOS device have a work function metal for the gate structure of the NMOS device and another work function metal for the PMOS device. During the process of forming the conventional gate structures of the CMOS device, tantalum layer for the PMOS device is blanketly deposited. A portion of the tantalum layer disposed on the NMOS device is removed, and a ruthenium layer for the NMOS device is blanketly deposited. Then, the ruthenium layer disposed on the PMOS is removed. Accordingly, the formation of the conventional gate structures of the CMOS requires at least two deposition processes and two removing processes for forming a corresponding work function metal on the PMOS device or the NMOS device. Therefore, the manufacturing process for forming the gate structures of the CMOS device is complicated.

Therefore, the semiconductor technology is developed to simplify the manufacturing process for forming the gate structures of the CMOS device and to form the gate structures with high performance.

SUMMARY OF THE INVENTION

It is therefore a primary objective of the present invention to provide a method of forming gate structures of a CMOS device. Initially, a substrate is provided. The substrate has an NMOS region, a PMOS region, a gate dielectric layer, a high-K material layer, a cap layer and at least a work function modulation layer disposed on the NMOS region and the PMOS region. A nitrogen doping process is perform to dope nitrogen into a portion of the work function modulation layer disposed on the PMOS region, so as to form an N-rich work function modulation layer on the PMOS region. A nonmetallic conductive layer is formed blanketly covering the work function modulation layer and the N-rich work function modulation layer. A portion of the nonmetallic conductive layer, the work function modulation layer, the cap layer, the high-K material layer, and the gate dielectric layer is removed to form a first gate structure on the NMOS region and a second gate structure on the PMOS region.

According to the claimed invention, a CMOS device is provided. The CMOS device has a NMOS device and a PMOS device. The NMOS device has a first gate structure, a source and a drain. The first gate structure is a single metal gate, and has a Ti-rich work function modulation layer and a first nonmetallic conductive layer disposed on the Ti-rich work function modulation layer. The PMOS device has a second gate structure, a source, and a drain. The second gate structure is a single metal gate, and has a N-rich work function modulation layer and a second nonmetallic conductive layer disposed on the N-rich work function modulation layer.

According to the claimed invention, the present invention further provides another method of forming gate structures of a CMOS device. Initially, a substrate is provided. The substrate includes an NMOS device, a PMOS device and a dielectric layer covering the substrate. The NMOS device has a first dummy gate structure embedded in the dielectric layer in the NMOS device. The first gate structure has a first work function modulation layer and a first nonmetallic conductive layer disposed on the first work function modulation layer. The PMOS device has a second dummy gate structure embedded in the dielectric layer in the PMOS device. The second gate structure has a second work function modulation layer and a second nonmetallic conductive layer disposed on the second work function modulation layer. Then, the second nonmetallic conductive layer is removed to form an opening in the second gate structure that the opening exposes the second work function modulation layer. A nitrogen doping process is performed to dope nitrogen into the second work function modulation layer through the opening, so as to form an N-rich work function modulation layer. A third nonmetallic conductive layer is filled into the opening.

The method of the present invention only uses one work function modulation layer, and modulates the work function of a portion of the function modulation layer disposed for the PMOS device by means of doping nitrogen. Therefore, the method of the present invention simplifies the manufacturing process of forming gate structure of the CMOS device.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 1 to FIG. 4. FIG. 1 to FIG. 4 are schematic diagrams illustrating a method of forming the gate structures of the CMOS device according to a preferred embodiment of the present invention. Please refer to FIG. 1. A substrate 10, such as a silicon substrate or a silicon-on-insulator (SOI) substrate, is provided. The substrate 10 has an NMOS region 12 and a PMOS region 14. The NMOS region 12 is disposed on a P-well 13, and the PMOS region 14 is disposed on an N-well 15. The substrate 10 has a plurality of isolation structures for electrically isolating the NMOS region 12 and PMOS region 14. For example, each of the isolation structure may be the shallow trench isolation (STI) 16 shown in FIG. 1, or a field oxide (not shown). The substrate 10 further includes a gate dielectric layer 18, a high-K material layer 20, cap layers 221, 222, and a work function modulation layer 24 disposed thereon. The gate dielectric layer 18 may includes silicon oxide, oxy-nitride, silicon nitride, or combinations thereof. The gate dielectric layer 18 may be formed by a thermal oxidation process, a nitridation process, or a chemical vapor deposition process. The high-K material layer 20 may include $SiO_2$, SiN, oxy-nitride, HfSiON, $HfO_2$, $Al_2O_3$, $TaO_3$, metal oxide, or combinations thereof. The cap layers 221, 222 made of nonmetallic materials are used for modifying work function. The cap layers 221, 222 may include $LaO_2$, $Dy_2O_3$, MgO), or $Al_2O_3$. In the present embodiment, the cap layer 221 disposed on the NMOS region 12 is a $LaO_2$ layer, and the cap layer 222 disposed on the PMOS region 14 is an $Al_2O_3$ layer.

Figure 1:
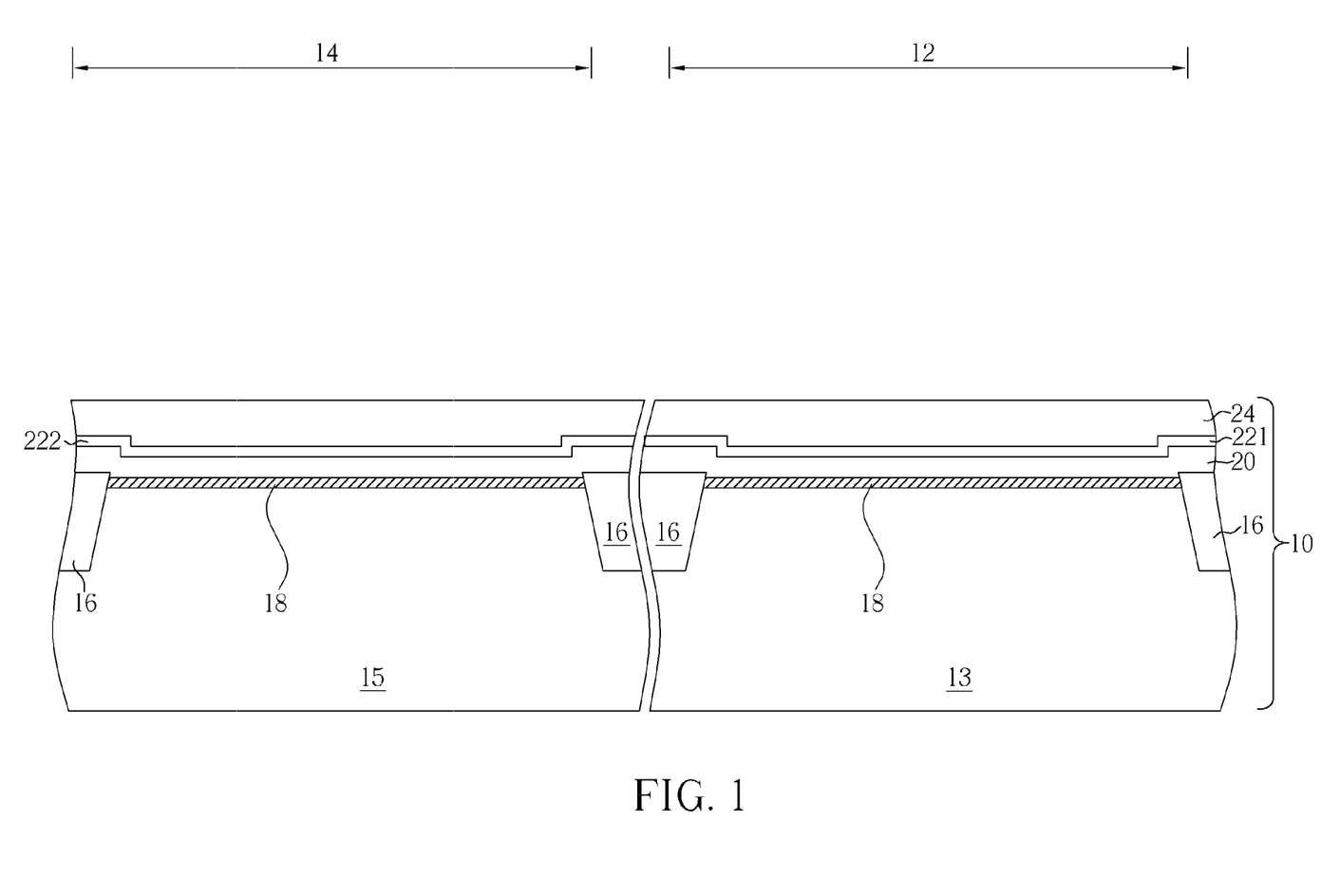
FIG. 1 to FIG. 4 are schematic diagrams illustrating a method of forming the gate structures of the CMOS device according to a preferred embodiment of the present invention.
Figure 2:
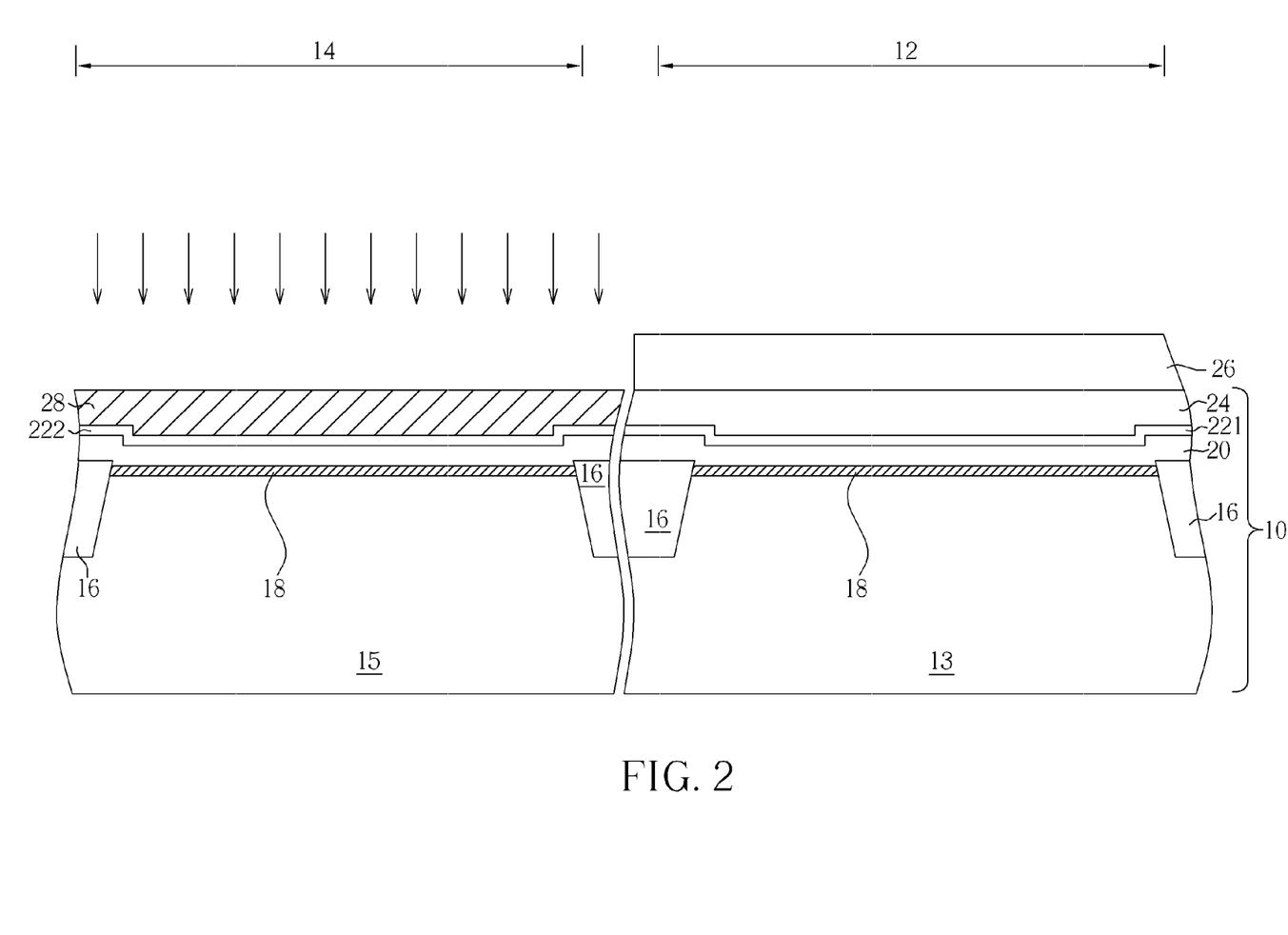

Please refer to FIG. 2, a patterned mask 26, such as a photoresist or a hard mask, is formed covering on the work function modulation layer 24 disposed on the NMOS region 12. The patterned mask 26 exposes. The work function modulation layer 24 disposed on the PMOS region 14. A nitrogen doping process is performed, for example, an ion implantation process. The ion implantation process is performed with an implant energy of approximately 10-100 KeV and an implant dosage of approximately $1 \times 10^{16}$ ion/$cm^2$ to dope nitrogen into a portion of the work function modulation layer 24 disposed on the PMOS region 14, so as to form an N-rich work function modulation layer 28. It should be noted that the original work function modulation layer 24 covering on the cap layer 221, 222 is a titanium (Ti)-rich work function modulation layer, such as a Ti layer, which has a work function approximately of 4.1±0.3 eV. After the nitrogen doping process, the portion of the work function modulation layer 24 disposes on the PMOS region 14 is transformed into the N-rich work function modulation layer 28, and has a increased work function approximately of 5.1±0.3 eV. In addition, the nitrogen doping process may be performed by a plasma doping process, a gas source plasma doping process, a solid source plasma doping process, or a high-temperature rapid vapor doping (RVD) process.

Figure 3:
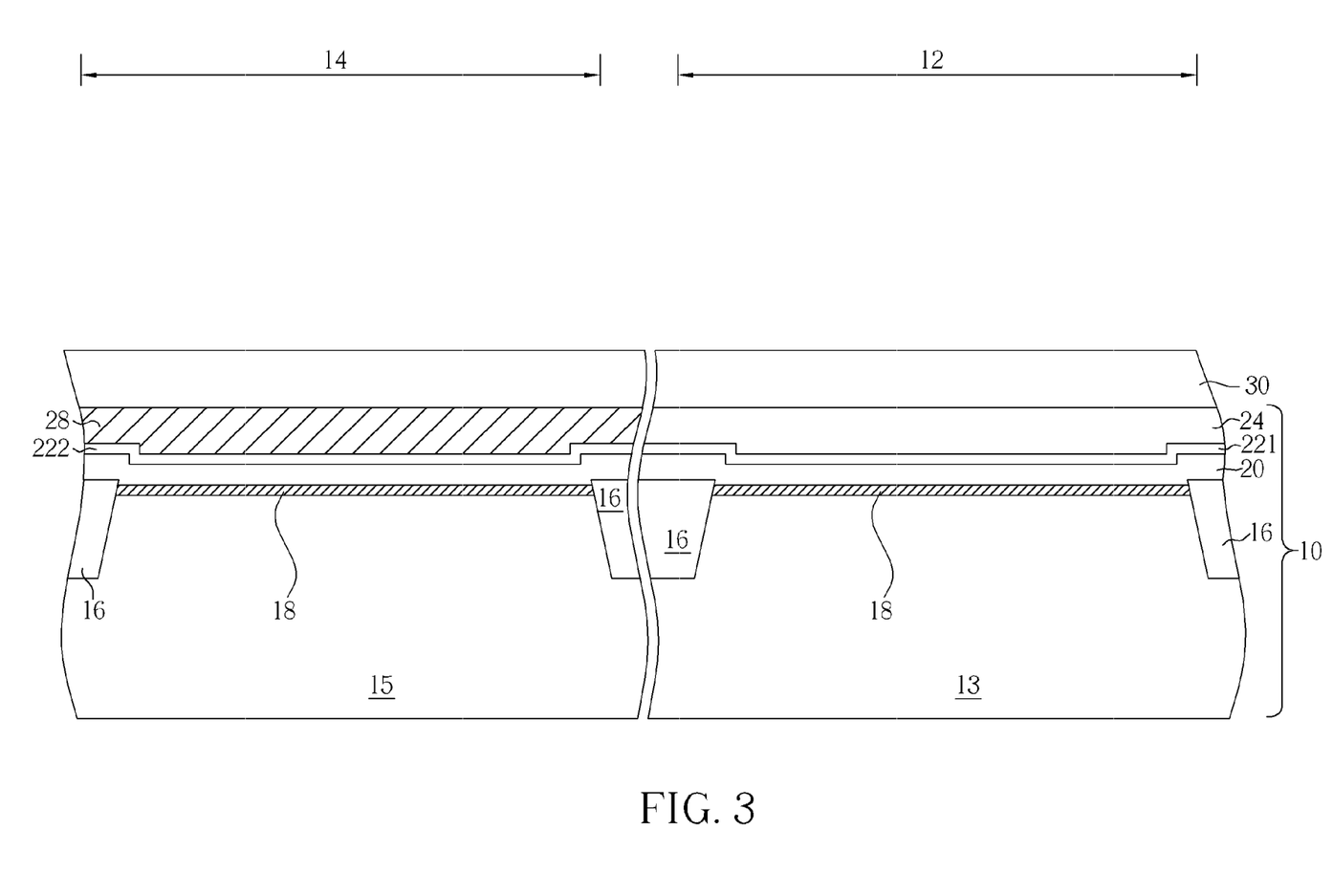
Figure 4:
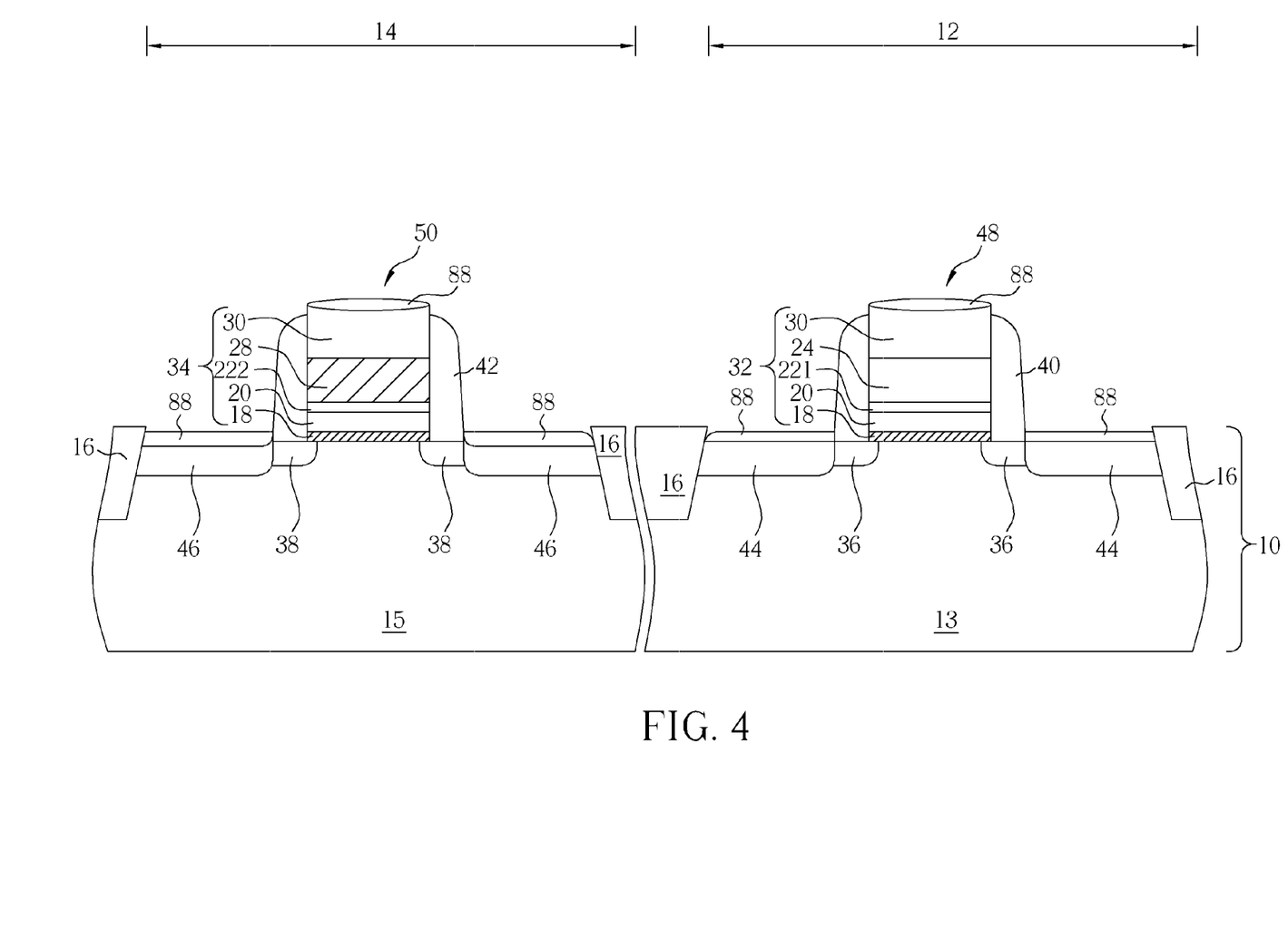

As shown in FIG. 3, the patterned mask 26 disposed on the NMOS region 12 is removed. A nonmetallic conductive layer 30, such as a doped polysilicon layer, is blanketly deposited covering the work function modulation layer 24 and the N-rich work function modulation layer 28. An anti-reflective coating is formed optionally covering the nonmetallic conductive layer 30. As shown in FIG. 4, a lithography process is performed to form a mask, such as a photoresist or a hard mask, having a gate pattern (not shown) on the nonmetallic conductive layer 30. An etching process is performed to remove the nonmetallic conductive layer 30, the work function modulation layer 24, the N-rich work function modulation layer 28, the cap layer 221, 222, the high-K material layer 20, and the gate dielectric layer 18 exposed by the mask, so as to form a first gate structure 32 in the NMOS region 12 and a second gate structure 34 in the PMOS region 14.

Since the first gate structure 32 and the second gate structure 34 has only one metal layer, for example, the work function modulation layer 24 of the first gate structure 32 and the Ti-rich work function modulation layer 28 of the second gate structure 34, the first gate structure 32 and the second gate structure 34 may be considered as a single metal gate, respectively.

In the following process, several ion implantation processes are performed to form a first light doped drain (LDD) 36 in the substrate 10 beside the first gate structure 32 in the NMOS region 12, and to form a second LDD 38 in the substrate 10 beside the second gate structure 34 in the PMOS region 12. A respective spacer 40, 42 is formed beside the first gate structure 32 and the second gate structure 34. Then, several ion implantation processes are performed to form a first source/drain 44 beside the first gate structure 32, and to form a second source/drain 46 beside the second gate structure 34, and so that a NMOS device 48 and a PMOS device 50 are respectively formed. A self-aligned silicide (salicide) process is performed to for a respective salicide layer 88 on the first gate structure 32, the second gate structure 34, the first source/drain 44, and the second source/drain 46.

Figure 5:
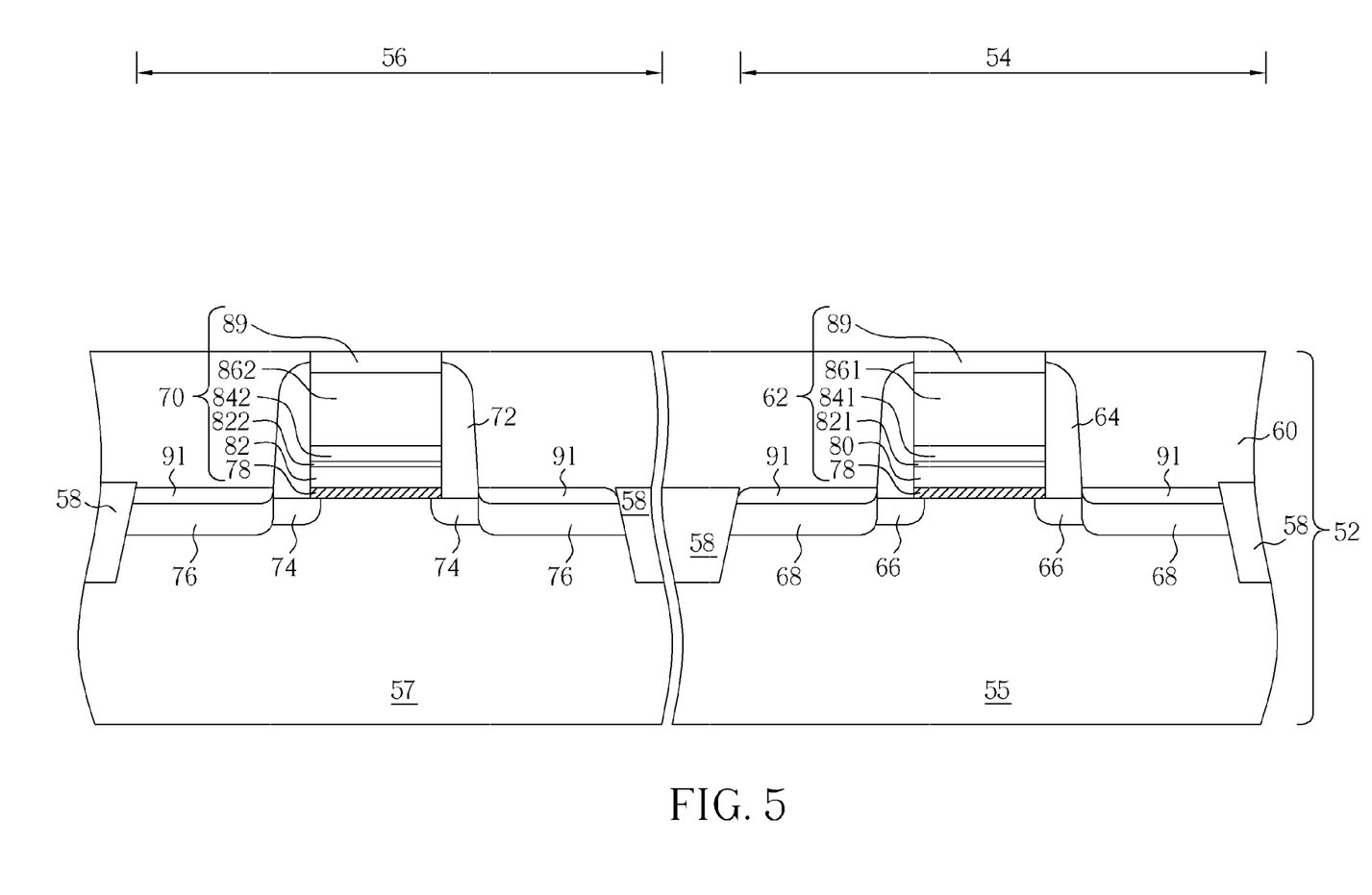
FIG. 5 to FIG. 8 are schematic diagrams illustrating a method of forming the gate structures of the CMOS device according to another preferred embodiment of the present invention.

Please refer to FIG. 5 to FIG. 8, which are schematic diagrams illustrating a method of forming the gate structures of the CMOS device according to another preferred embodiment of the present invention. As shown in FIG. 5, a substrate 52 is provided. The substrate 52 includes an NMOS device 54, a PMOS device 56, a plurality of isolation structures for electrically isolating the NMOS device 54 and the PMOS device 56, and a dielectric layer 60 covering the substrate 52. The isolation structures may be the STI 58 shown in FIG. 5 or field oxides (not shown). The NMOS device 54 is disposed on a P-well 55, and includes a first dummy gate structure 62, a spacer 64, a second LDD 74 and a second source/drain 76. The PMOS device 56 is disposed on an N-well 57, and has a second dummy gate structure 70, a spacer 72, a second LDD 74 and a second source/drain 76. The first dummy gate structure 62 and the second dummy gate structure 70 are embedded in the dielectric layer 60 and have the same material layers, such as a gate dielectric layer 78, a high-K material layer 80 and a respective cap layer 821, 822. The first dummy gate structure 62 further has a first work function modulation layer 841, a first nonmetallic conductive layer 861 and a mask layer 89 disposed on the cap layer 821. The second dummy gate structure 70 further has a second work function modulation layer 842, a second nonmetallic conductive layer 862, and a mask layer 88 disposed on the cap layer 822. In addition, the first work function modulation layer 841 and the second work function modulation layer 842 are made of the same material. In the present embodiment, the first work function modulation layer 841 and the second work function modulation layer 842 are made of Ti layers. The first nonmetallic conductive layer 861 and the second nonmetallic conductive layer 862 are made of doped polysilicon. However, the materials of the first work function modulation layer 841, the second work function modulation layer 842, the first nonmetallic conductive layer 861, and the second nonmetallic conductive layer 862 are not limited to those materials shown in the present embodiment. A salicide layer 91 is respectively formed on the first source/drain 68 and the second source/drain 76.

Figure 6:
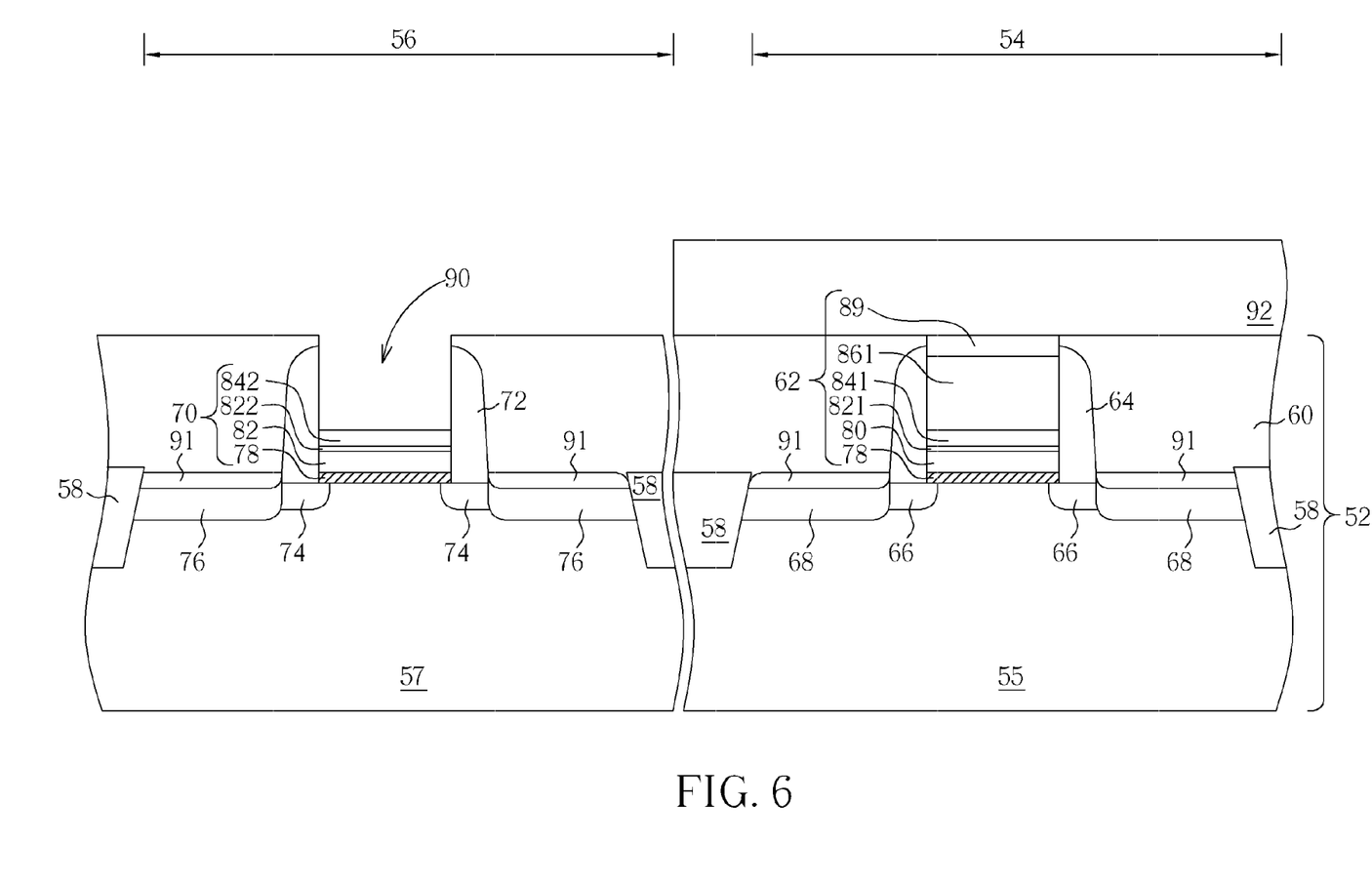
Figure 7:
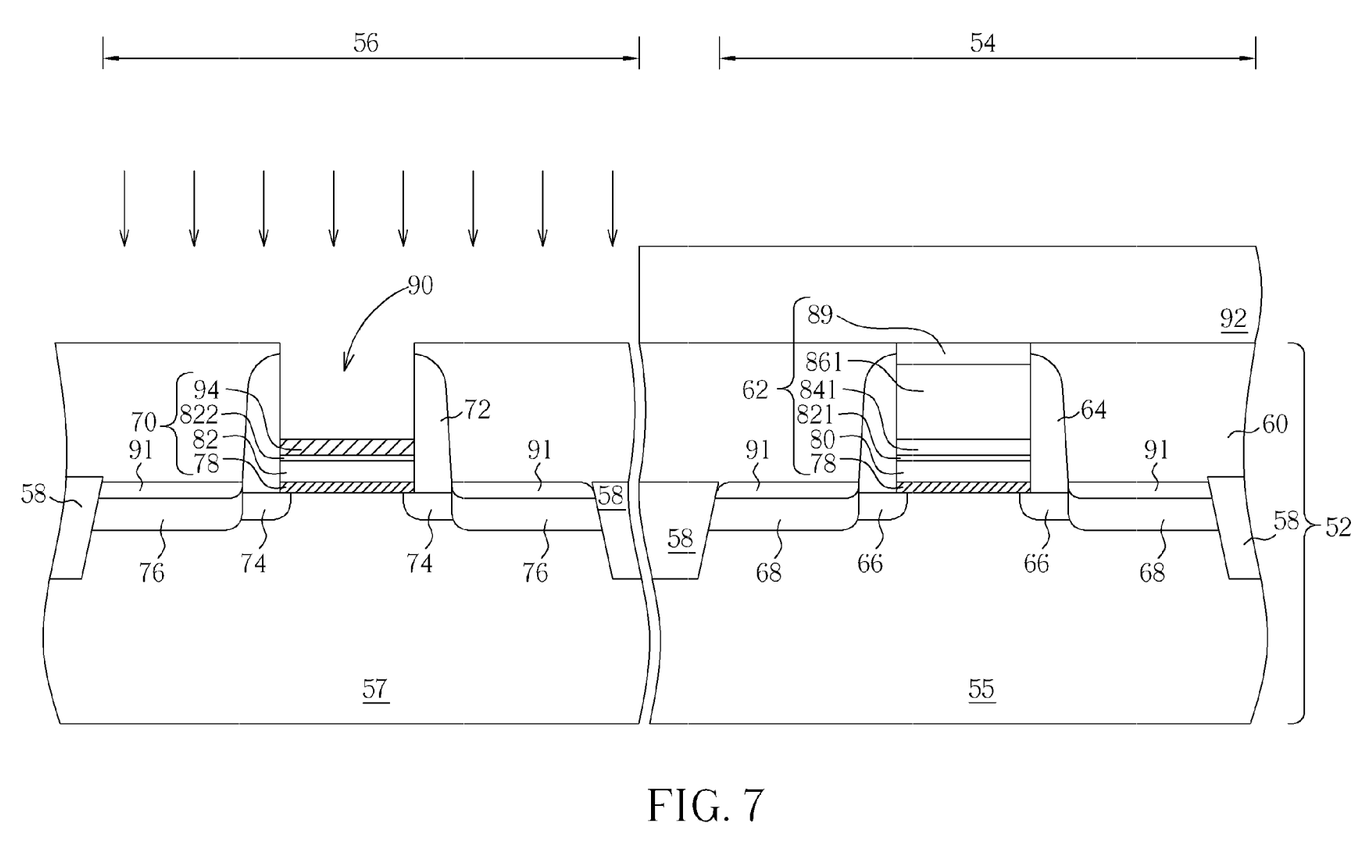

Please refer to FIG. 6. A patterned mask 92, such as a photoresist or a hard mask, is formed on a portion of the dielectric layer 60 to covers the NMOS device 54 at least. The mask layer 89 and the second nonmetallic conductive layer 862 disposed on the top of the second dummy gate structure 70 is removed to form an opening 90. The opening 90 exposes the second work function modulation layer 842 of the second dummy gate structure 70. Please refer to FIG. 7, a nitrogen doping process, such as an ion implantation process is performed. The ion implantation process is performed with an implant energy of approximately 10-100 KeV and an implant dosage of approximately $1 \times 10^{16}$ ion/$cm^2$ to dope nitrogen into the second work function modulation layer 842 of the PMOS device 56, so as to form an N-rich work function modulation layer 94. It should be noted that the original first work function modulation layer 841 and the second work function modulation layer 842 are material layers made of the same process; for example the Ti layer, which has a work function approximately of 4.1±0.3 eV. After the nitrogen doping process, the second work function modulation layer 842 is transformed into the N-rich work function modulation layer 94, and has a increased work function approximately of 5.1±0.3 eV. In addition, the nitrogen doping process may be performed by a plasma doping process, a gas source plasma doping process, a solid source plasma doping process, or a high-temperature rapid vapor doping (RVD) process.

Figure 8:
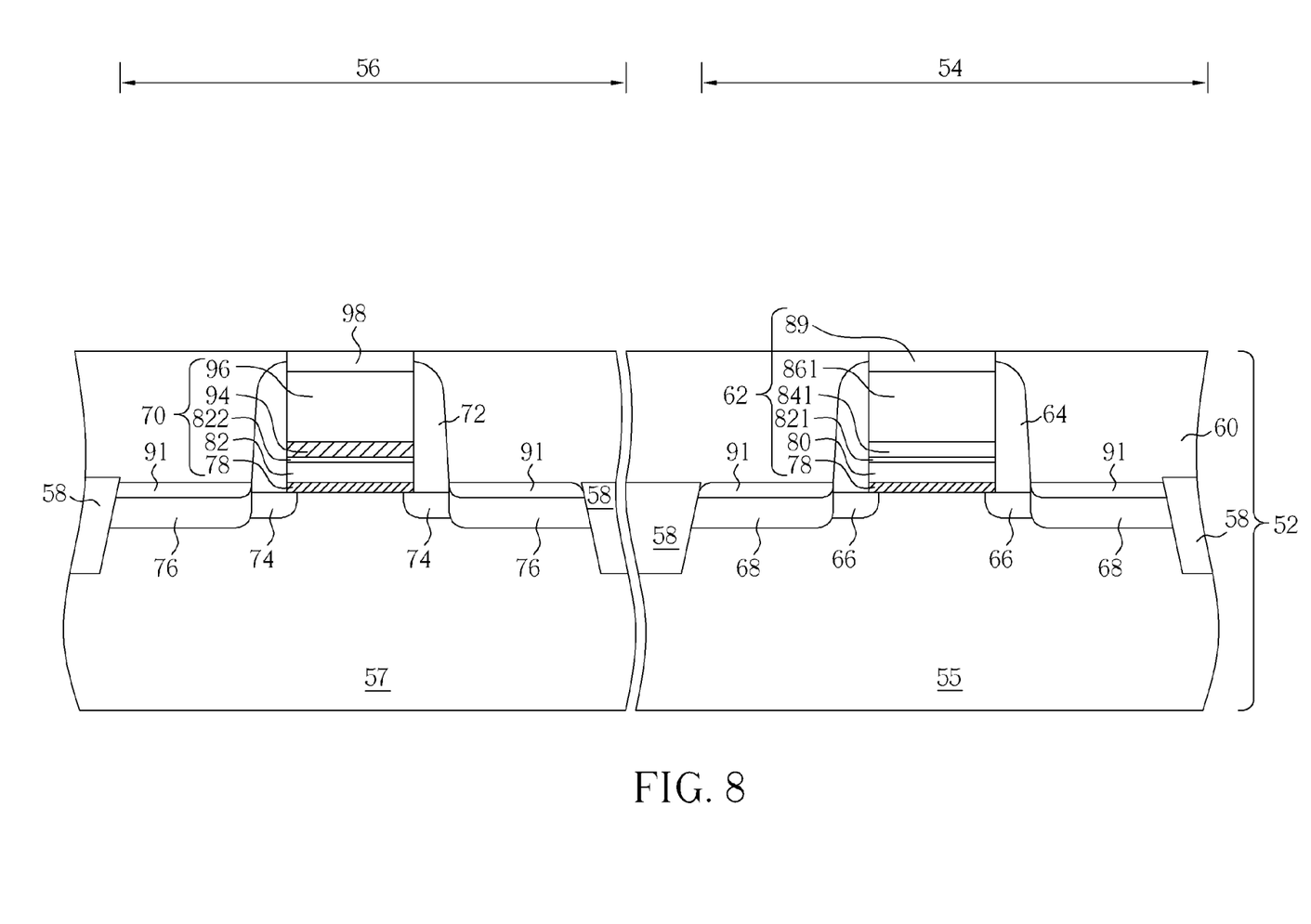

As shown in FIG. 8, the patterned mask 92 disposed on the NMOS device 54 is removed. A third nonmetallic conductive layer 96, such as a doped polysilicon layer is deposited to fill into the opening 90. A salicide process is performed to form a salicide layer 98 on the nonmetallic conductive layer 96. Accordingly, the CMOS device of the present invention is made.

As described above, the method of the present invention may be combined into a gate first process for forming CMOS device, or a gate last process for forming the CMOS device. The method of the present invention is performed to form a work function modulation layer on the PMOS device and to dope nitrogen into the function modulation layer by the nitrogen doping process. The nitrogen doping process increases the work function of the work function modulation layer on the PMOS device to form the N-rich work function modulation layer. Therefore, the work function N-rich work function modulation layer is greater than that of the original work function modulation layer. Accordingly, the present invention utilizes the nitrogen doping process to form the work function modulation layer having a respective work function on the PMOS device or the NMOS device. As a result, the manufacturing process of forming the gate structures of the CMOS device is simplified. In addition, the N-rich work function modulation layer on the PMOS device is formed by the nitrogen doping process. The overlapping issue between the work function metal layer on the PMOS device and the work function metal layer on the NMOS device work function metal in the conventional CMOS device may be prevented. Furthermore, the materials of the work function modulation layer are not limited to the Ti layer shown in the above-mentioned embodiments. The materials of the work function modulation layer may include a TiN layer, which is transformed into an N-rich TiN after the performance of nitrogen doping process. The materials of the work function modulation layer may include a TaN layer, which is transformed into an N-rich TaN after the performance of the nitrogen doping process. The materials of the work function modulation layer may selected from a metal having a work function approximately of 4.1±0.3 eV, and the nitrides of the metal having a work function approximately of 5.1±0.3 eV.

Those skilled in the art will readily observe that numerous modifications and alterations of the device and method may be made while retaining the teachings of the invention.

What is claimed is:

1. A CMOS device, comprising:
   a NMOS device comprising a first gate structure, a source and a drain, the first gate structure being a single metal gate and comprising:
   a Ti-rich work function modulation layer; and
   a first nonmetallic conductive layer disposed on the Ti-rich work function modulation layer; and
   a PMOS device comprising a second gate structure, a source and a drain, the second gate structure being a single metal gate and comprising:
   an N-rich work function modulation layer; and
   a second nonmetallic conductive layer disposed on the N-rich work function modulation layer;
   wherein each of the first gate structure and the second gate structure comprises a gate dielectric layer, a high-k material layer and a cap layer, wherein the cap layer of the first gate structure is between the high-k material layer and the Ti-rich work function modulation layer and the cap layer of the second gate structure is between the high-k material layer and the N-rich work function modulation layer.

2. The CMOS device of claim 1, wherein the N-rich work function modulation layer has a greater work function than the work function modulation layer.

3. The CMOS device of claim 2, wherein the N-rich work function modulation layer has a work function approximately of 5.1±0.3 eV, the Ti-rich work function modulation layer has a work function approximately of 4.1±0.3 eV.

4. The CMOS device of claim 1, wherein the Ti-rich work function modulation layer comprises Ti, and the N-rich work function modulation layer comprises TiN.

* * * * *